US012644859B2

(12) United States Patent　　　(10) Patent No.:　US 12,644,859 B2
Rosenstein et al.　　　　　　　　(45) Date of Patent:　　Jun. 2, 2026

(54) INTEGRATED PLATFORMS FOR MICROSCALE SPATIALLY-RESOLVED ELECTROCHEMICAL MEASUREMENTS

(71) Applicant: Brown University, Providence, RI (US)

(72) Inventors: Jacob K. Rosenstein, Providence, RI (US); Kangping Hu, Providence, RI (US)

(73) Assignee: Brown University, Providence, RI (US)

( * ) Notice: Subject to any disclaimer, the term of this patent is extended or adjusted under 35 U.S.C. 154(b) by 908 days.

(21) Appl. No.: 17/497,603

(22) Filed: Oct. 8, 2021

(65) Prior Publication Data

US 2022/0214304 A1　　Jul. 7, 2022

Related U.S. Application Data

(60) Provisional application No. 63/174,903, filed on Apr. 14, 2021, provisional application No. 63/089,735, filed on Oct. 9, 2020, provisional application No. 63/089,732, filed on Oct. 9, 2020.

(51) Int. Cl.
G01N 27/416　　(2006.01)
G01N 27/27　　(2006.01)
G01N 27/30　　(2006.01)
G01N 27/414　　(2006.01)
G01R 27/26　　(2006.01)

(52) U.S. Cl.
CPC ..... G01N 27/4148 (2013.01); G01N 27/4145 (2013.01); G01R 27/2605 (2013.01)

(58) Field of Classification Search
CPC ................................................ G01N 27/4148
See application file for complete search history.

(56) References Cited

U.S. PATENT DOCUMENTS

| | | | |
|---|---|---|---|
| 4,879,517 | A | 11/1989 | Connery et al. |
| 7,500,379 | B2 | 3/2009 | Hines |
| 8,293,082 | B2 | 10/2012 | Rothberg et al. |
| 9,001,848 | B2 | 4/2015 | Tzeng et al. |
| 9,360,509 | B2 | 6/2016 | Naughton et al. |
| 9,839,367 | B2 | 12/2017 | Litt et al. |
| 10,126,289 | B2 | 11/2018 | Wang et al. |

(Continued)

FOREIGN PATENT DOCUMENTS

| | | |
|---|---|---|
| CN | 101669026 B | 5/2014 |
| CN | 104677967 A | 6/2015 |

(Continued)

OTHER PUBLICATIONS

Hu , et al., "A Large-Scale Multimodal CMOS Biosensor Array With 131,072 Pixels and Code-Division Multiplexed Readout", IEEE Solid-State Circuits Letters, vol. 4, 2021, pp. 48-51.

(Continued)

*Primary Examiner* — Peter Bradford

(74) *Attorney, Agent, or Firm* — Banner & Witcoff, Ltd.

(57)　　　　　ABSTRACT
A complementary metal-oxide-semiconductor sensor array includes an active sensing area of pixels arranged in an array with a pitch, each pixel including an exposed surface electrode alongside switches and logic gates, and non-overlapping clocks configured to rapidly charge and discharge the exposed surface electrode, wherein control signals steer a switched output current between shared column outputs.

8 Claims, 12 Drawing Sheets

(56) References Cited

U.S. PATENT DOCUMENTS

| | | | |
|---|---|---|---|
| 10,325,951 B2 | 6/2019 | Graff et al. | |
| 10,379,079 B2 * | 8/2019 | Fife | G01N 27/414 |
| 2002/0005580 A1 | 1/2002 | Goodman et al. | |
| 2004/0132204 A1 | 7/2004 | Chou et al. | |
| 2005/0221594 A1 | 10/2005 | Chou et al. | |
| 2005/0247559 A1 | 11/2005 | Frey et al. | |
| 2007/0084721 A1 | 4/2007 | Hsung et al. | |
| 2008/0067081 A1 | 3/2008 | Chou et al. | |
| 2010/0007326 A1 * | 1/2010 | Nakazato | G01N 27/4148 324/71.5 |
| 2010/0140079 A1 | 6/2010 | Chou et al. | |
| 2010/0221846 A1 * | 9/2010 | Widdershoven ... | G01N 33/5438 436/512 |
| 2012/0000274 A1 * | 1/2012 | Fife | G01N 27/4145 257/253 |
| 2014/0087954 A1 * | 3/2014 | Seligmann | C12Q 1/6869 506/2 |
| 2014/0318958 A1 | 10/2014 | Hassibi et al. | |
| 2014/0326600 A1 * | 11/2014 | Li | G01N 27/3271 257/253 |
| 2014/0346058 A1 | 11/2014 | Robitzki et al. | |
| 2015/0330941 A1 | 11/2015 | Smith et al. | |
| 2016/0033449 A1 | 2/2016 | Fife | |
| 2016/0245788 A1 | 8/2016 | Wang et al. | |
| 2017/0067890 A1 | 3/2017 | Lin et al. | |
| 2017/0261457 A1 * | 9/2017 | Suy | G01N 27/223 |
| 2017/0272277 A1 | 9/2017 | Hines et al. | |
| 2018/0204036 A1 | 7/2018 | Akhavan Fomani et al. | |
| 2019/0117083 A1 | 4/2019 | Wang et al. | |
| 2019/0204204 A1 | 7/2019 | Sarioglu | |
| 2019/0257829 A1 | 8/2019 | Ludwig et al. | |
| 2019/0369044 A1 | 12/2019 | Chang et al. | |
| 2020/0173958 A1 * | 6/2020 | Chiang | G01N 33/5438 |
| 2020/0271620 A1 | 8/2020 | Cheng et al. | |
| 2020/0359921 A1 | 11/2020 | Manoli et al. | |
| 2021/0199619 A1 | 7/2021 | Sekine | |

FOREIGN PATENT DOCUMENTS

| | | |
|---|---|---|
| CN | 109307701 A | 2/2019 |
| EP | 2342552 A1 | 7/2011 |
| EP | 2807478 A1 | 12/2014 |
| EP | 2939185 A1 | 11/2015 |

OTHER PUBLICATIONS

Hu , et al., "High Frequency Dielectric Spectroscopy Array with Code Division Multiplexing for Biological Imaging", IEEE Biomedical Circuits and Systems Conference (BioCAS),, 2019, 4 pages.

Manickam , et al., "A CMOS Electrochemical Impedance Spectroscopy Biosensor Array for Label-Free Biomolecular Detection", IEEE International Solid-State Circuits Conference, Session 6, Displays & Biomedical Devices, 6.9, Feb. 8, 2010, 3 pages.

Widdershoven , et al., "A CMOS Pixelated Nanocapacitor Biosensor Platform for High-Frequency Impedance Spectroscopy and Imaging", IEEE Transactions on Biomedical Circuits and Systems, vol. 12, No. 6, Dec. 2018, pp. 1369-1382.

Arcadia , et al., "CMOS electrochemical imaging arrays for the detection and classification of microorganisms", IEEE International Symposium on Circuits and Systems, 2021, 5 pages.

Chen , et al., "Column-Parallel Digital Correlated Multiple Sampling for Low-Noise CMOS Image Sensors", IEEE Sensors Journal, vol. 12, No. 4, 2012, pp. 793-799.

Cong , et al., "A 3600×3600 Large-scale ISFET Sensor Array for High-throughput pH Sensing", IEEE 12th International Conference on ASIC, 2017, pp. 957-960.

Cossettini , et al., "Space and frequency dependence of nanocapacitor array sensors response to microparticles in electrolyte", IEEE Sensors Journal, vol. 21, No. 4, 2020, pp. 4696-4704.

Dubois , et al., "A 10 000 fps CMOS Sensor With Massively Parallel Image Processing", IEEE Journal of Solid-state Circuits, vol. 43, No. 3, 2008, pp. 706-717.

Hassibi , et al., "A Programmable 0.18-μm CMOS Electrochemical Sensor Microarray for Biomolecular Detection", IEEE Sensors Journal, vol. 6, No. 6, Dec. 6, 2006, pp. 1380-1388.

Hu , et al., "A 13.1 mm2 512×256 Multimodal CMOS Array for Spatiochemical Imaging of Bacterial Biofilms", 2022 IEEE Custom Integrated Circuits Conference (CICC), 2022, 9 pages.

Hu , et al., "A Fringe Field Shaping CMOS Capacitive Imaging Array", IEEE Sensors,, 2021, pp. 1-4.

Hu , et al., "Low Noise CMOS ISFETs Using In-Pixel Chopping", IEEE Biomedical Circuits and Systems Conference, 2021, pp. 1-4.

Hu , et al., "Super-Resolution Electrochemical Impedance Imaging with a 100×100 CMOS Sensor Array", IEEE Biomedical Circuits and Systems Conference (BioCAS), 2021, pp. 1-4.

Jainwal , et al., "1/f Noise Reduction using In-Pixel Chopping in CMOS Image Sensor", Journal Of Latex Class Files, vol. 13, No. 9, Jan. 2016, 5 pages.

Jainwal, Kapil , "Low-Frequency Noise Reduction Using In-Pixel Chopping To Enhance The Dynamic Range of a CMOS Image Sensor", Journal Of Latex Class Files, vol. 13, No. 9, Jan. 2016, 11 pages.

Jung , et al., "A 21952-pixel multi-modal CMOS cellular sensor array with 1568-pixel parallel recording and 4-point impedance sensing", Symposium on VLSI Circuits, 2019, pp. C62-C63.

Jung , et al., "A CMOS 21 952-pixel multi-modal cell-based biosensor with four-point impedance sensing for holistic cellular characterization", IEEE Journal of Solid-State Circuits, vol. 56, No. 8, Aug. 2021, pp. 2438-2451.

Linderholm , et al., "Cell Culture Imaging Using Microimpedance Tomography", IEEE Transactions on Biomedical Engineering, vol. 55, 2008, pp. 138-146.

Moser , et al., "A Scalable ISFET Sensing and Memory Array With Sensor Auto-Calibration for On-Chip Real-Time DNA Detection", IEEE Transactions on Biomedical Circuits and Systems, vol. 12, No. 2, 2018, pp. 390-401.

Nakazato, Kazuo , "An Integrated ISFET Sensor Array", Sensor, vol. 9, No. 11, Nov. 4, 2009, pp. 8831-8851.

Park , et al., "Biopsy needle integrated with multi-modal physical/ chemical sensor array", Biosensors & Bioelectronics, vol. 148, 2020, 11 pages.

Viswam , et al., "Impedance Spectroscopy and Electrophysiological Imaging of Cells With a High-Density CMOS Microelectrode Array System", IEEE Trans Biomed Circuits System, vol. 12, No. 6, 2018, pp. 1356-1368.

* cited by examiner

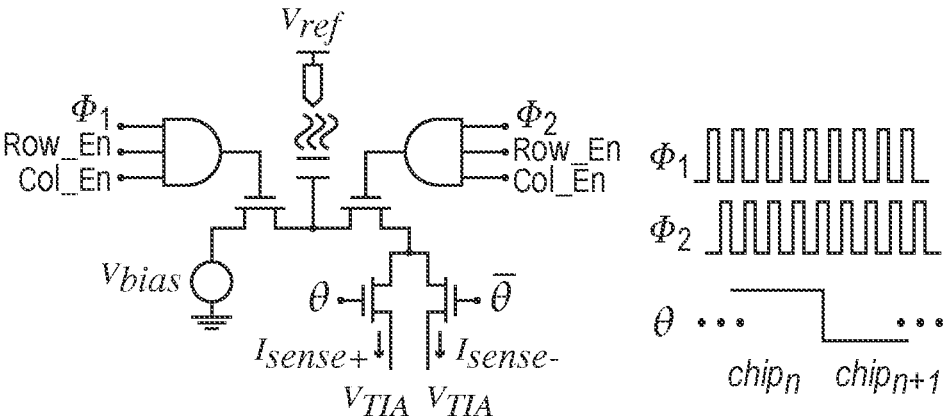
FIG. 1a
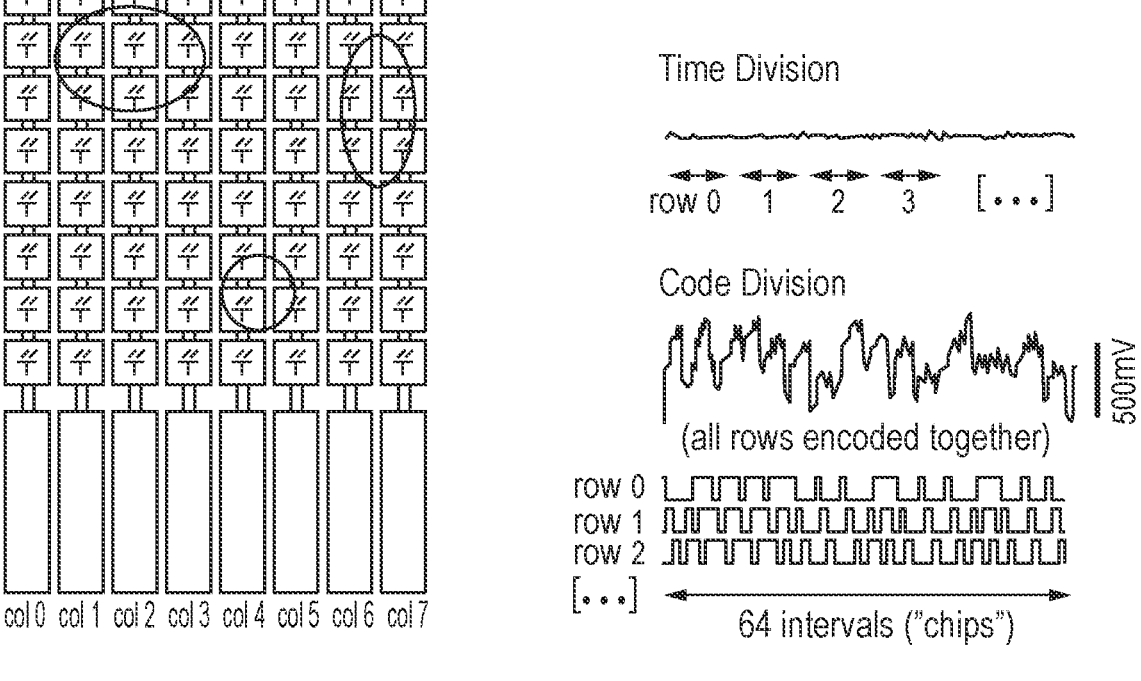
FIG. 1b
FIG. 1c

700

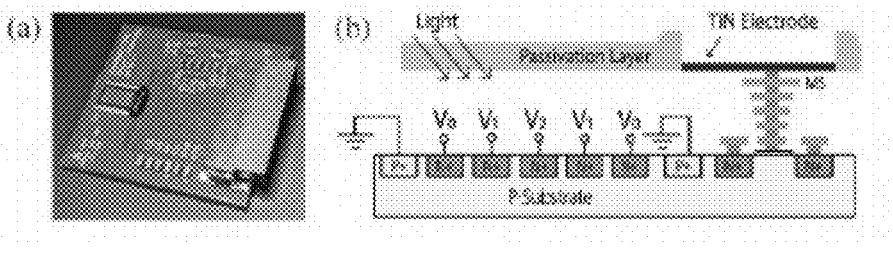
FIG. 9a                    FIG. 9b
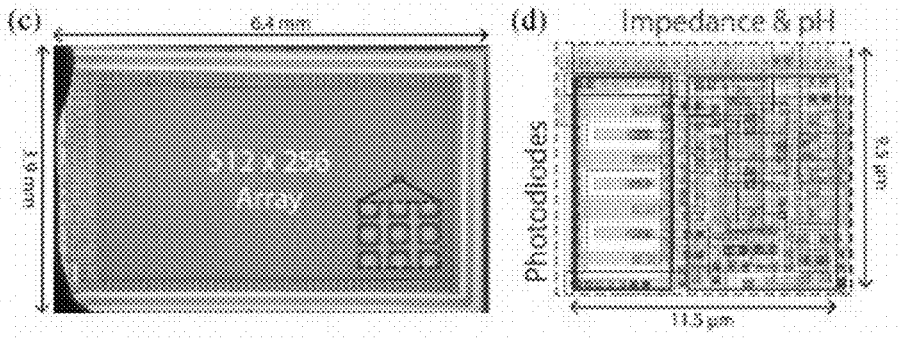
FIG. 9c                    FIG. 9d
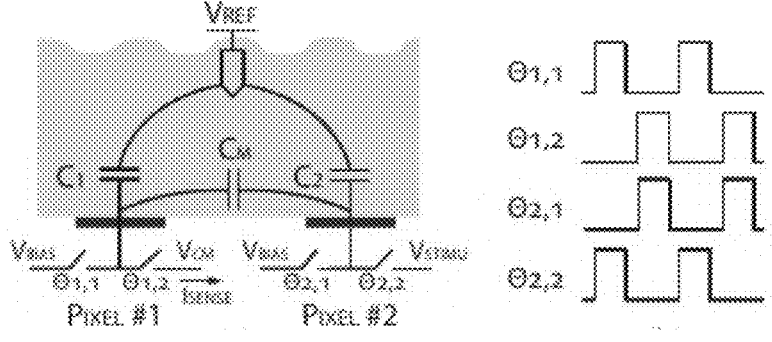
FIG. 10a                   FIG. 10b
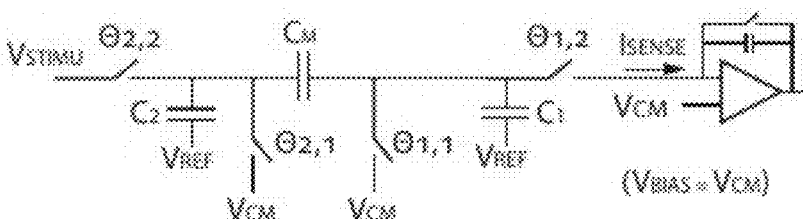
FIG. 10c

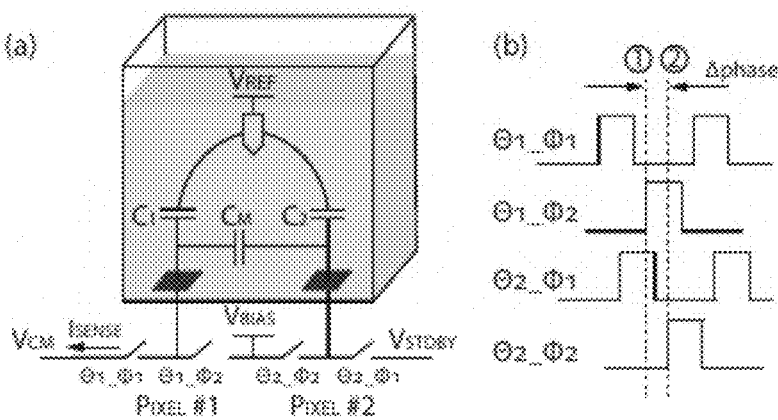
FIG. 13a                              FIG. 13b
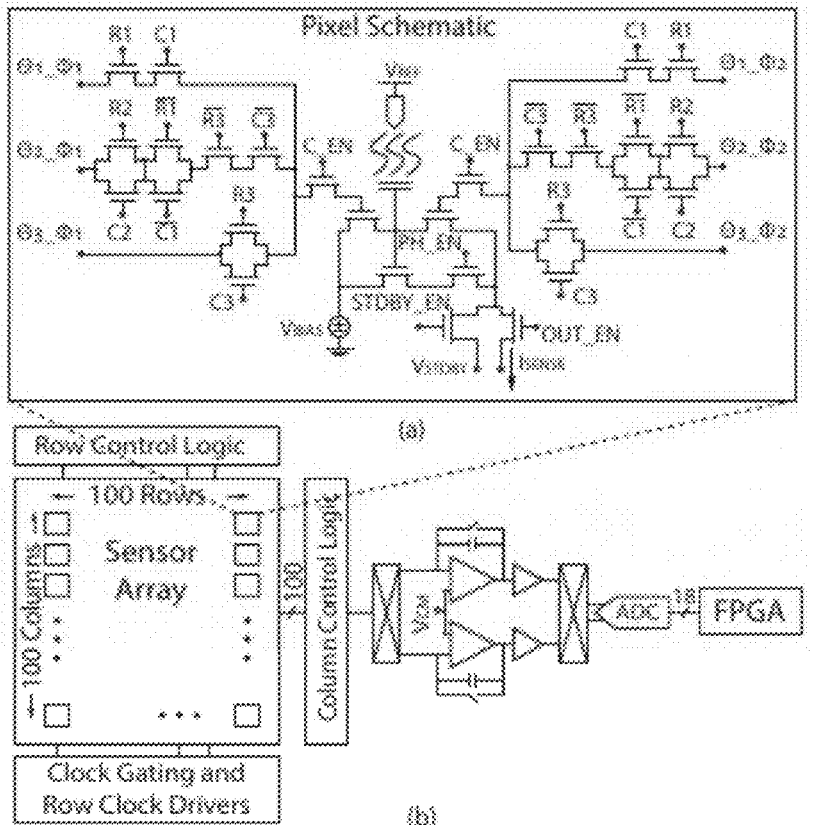
FIG. 14

INTEGRATED PLATFORMS FOR MICROSCALE SPATIALLY-RESOLVED ELECTROCHEMICAL MEASUREMENTS

CROSS REFERENCE TO RELATED APPLICATIONS

This application claims benefit from U.S. Provisional Patent Application Ser. No. 63/089,732, filed Oct. 9, 2020, U.S. Provisional Patent Application Ser. No. 63/089,735, filed Oct. 9, 2020, and U.S. Provisional Patent Application Ser. No. 63/174,903, filed Apr. 14, 2021, each of which is incorporated by reference in its entirety.

STATEMENT REGARDING GOVERNMENT INTEREST

This invention was made with government support under grant number 2027108 awarded by the National Science Foundation and grant number W911NF-15-1-0503 awarded by the Defense Advanced Research Projects Agency. The government has certain rights in the invention.

BACKGROUND OF THE INVENTION

Capacitive sensing and electrochemical impedance spectroscopy (EIS) are appealing technologies for miniaturized and integrated biochemical and cellular measurement systems because of their low cost and simple instrumentation. Yet despite their appeal, EIS biosensors can suffer from low dynamic range and low chemical specificity.

Moreover, amid the continued adoption of integrated circuit technology in biomedical applications, the ion-sensitive field effect transistor (ISFET) has cemented an important commercial role. CMOS compatible ISFET platforms can scale up to large dense arrays, enabling high throughput DNA sequencing and assays, cellular metabolism sensing, chemical imaging, and food safety screening. However, longer-duration applications such as cell culture monitoring can be challenging for ISFETs due to drift and flicker noise.

SUMMARY OF THE INVENTION

The following presents a simplified summary of the innovation in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In general, in one aspect, the invention features a complementary metal-oxide-semiconductor sensor array including an active sensing area of pixels arranged in an array with a pitch, each pixel including an exposed surface electrode alongside switches and logic gates, and non-overlapping clocks configured to rapidly charge and discharge the exposed surface electrode, wherein control signals steer a switched output current between shared column outputs.

In another aspect, the invention features an ion-sensitive field-effect transistor (ISFET) circuit including an array of ion-sensitive field-effect transistor pixels, each pixel comprising a first PMOS transistor and a second PMOS transistor, the first PMOS transistor acting as a sensing ISFET and the second PMOS transistor acting as a reference MOSFET, and a readout circuit.

In another aspect, the invention features a complementary metal-oxide-semiconductor sensor array including an active sensing area including pixels arranged in an array, each pixel including an exposed surface electrode, a high-frequency impedance circuit, an nMOS ISFET configured for pH sensing, and a photodetector.

In another aspect, the invention features a system including a 100×100 CMOS EIS sensor array that uses an area-efficient two-phase switching scheme to measure the mutual capacitance between pairs of nearby pixels.

In another aspect, the invention features a system including a high-density CMOS microelectrode array that can manipulate fringe fields of a measured pixel by configuring clock phases and bias voltages within a moving kernel of neighboring pixels.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

These and other features, aspects, and advantages of the present invention will become better understood with reference to the following description, appended claims, and accompanying drawings where:

FIGS. 1a, 1b and 1c illustrate a high frequency imaging array.

FIGS. 9a, 9b, 9c and 9d illustrate a chip.

FIGS. 10A, 10b, 10c illustrate a two-phase mutual capacitance measurement.

FIG. 13a illustrates a simple capacitance model.

FIG. 13b illustrates two sets of overlapping clocks.

FIG. 14 illustrates a pixel schematic and overall architecture.

DETAILED DESCRIPTION

Figure 2:
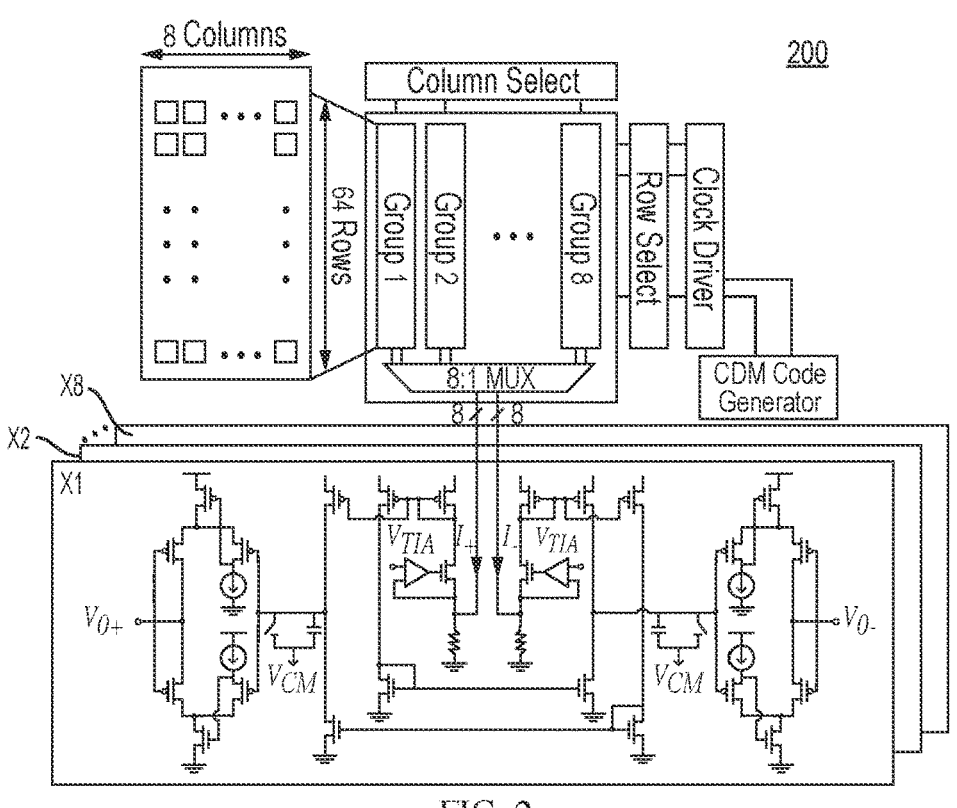
FIG. 2 illustrates a CMOS sensor array.

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

Radio frequency dielectric spectroscopy is an attractive paradigm for low-cost non-optical imaging of cells and bioparticles. While traditional electrochemical impedance spectroscopy is often performed at lower frequencies, working at radio frequencies can overcome ion screening effects and detect features farther from electrode surfaces. In a first embodiment, the present invention is a 64×64 sensing array with 10 μm pixels in 180-nm CMOS, supporting switching frequencies up to 100 MHz. The array features code-division multiplexed readout of all 64 rows simultaneously, which offers opportunities for extended integration times, higher frame rates, improved common-mode rejection, and new wide-bandwidth sensing modalities.

Capacitive sensing and electrochemical impedance spectroscopy (EIS) are appealing technologies for miniaturized and integrated biochemical and cellular measurement systems because of their low cost and simple instrumentation. Yet despite their appeal, EIS biosensors can suffer from low dynamic range and low chemical specificity. One cause of this trend is Debye screening, which causes kHz-range AC measurements at physiological conditions to be sensitive to chemical conditions and analytes within only a few nanometers of the working electrode. Exceptions to this rule are when arrays of electrodes can be placed far apart and used in coordination, such as in electrical impedance tomography.

To overcome ion screening, advances have been made in high frequency (1 MHz) impedance spectroscopy, which can enable measurements of features farther from the surface. However, high frequency dielectric spectroscopy remains under-explored, in part due to the challenge of designing microelectronics with suitably low noise, high bandwidth, high density, and low parasitics.

The present invention is a novel dielectric sensing array capable of producing electrochemical images at switching frequencies up to 100 MHz. In addition to traditional row-scanned image acquisition, the new sensor array can acquire data using code division multiplexing (CDM), which records all rows at once using orthogonal spreading codes. CDM can offer opportunities for extended integration times, faster frame rates, and improved rejection of parasitic capacitances within the array.

CMOS Sensor Array Design: Pixel Design

The active sensing area has 4,096 pixels arranged in a 64×64 array with a 10 micron pitch. As shown in FIGS. 1a, 1b and 1c, each pixel contains an exposed surface electrode alongside four switches and two logic gates. Non-overlapping clocks $\Phi_1$ and $\Phi_2$ rapidly charge and discharge the electrode, and control signals $\theta_1$ and $\theta_2$ steer the switched output current between two shared column outputs. In this prototype, the clocks are generated off-chip.

More specifically, in FIG. 1a, each sensing pixel electrode is charged and discharged with high frequency non-overlapping clocks $\Phi_1$ and $\Phi_2$, and the output signal current is steered into one of two output columns by a slower control signal $\theta$. In FIG. 2b, the array is designed to form an electrochemical image of cells and particles on the surface, based on the effective capacitance at each pixel. In FIG. 1c, by changing the behavior of $\theta$, the array supports both traditional time-division readout, as well as a code-division mode in which all rows can be read out simultaneously.

CMOS Sensor Array Design: Column Amplifiers

In FIG. 2, an exemplary CMOS sensor architecture 200 is shown. Column outputs from the array are directed into a high-bandwidth differential current buffer, followed by a pair of integration capacitors, and a pair of output buffers. The differential output voltage is then digitized by a 16-bit PCI data acquisition card, typically at 100 kS/s. On this exemplary chip, the 64 columns are multiplexed onto 8 independent readout channels.

The current buffers are gain-boosted cascode amplifiers with a simulated bandwidth of 400 MHz. An integration capacitor creates a low-pass filter with a time constant of 20 μs, averaging out the switched pixel currents. The simulated low frequency transimpedance gain is 110 dBΩ, and the simulated input referred noise floor of the system is 1 $fF_{rms}$, assuming a 1 kHz integration bandwidth, $f_{clk}$=50 MHz, and $(V_{TIA}-V_{bias})$=200 mV.

CMOS Sensor Array Design: Code Division Readout

Code Division Multiplexing (CDM) is a widely used technique in telecommunications. By assigning a unique orthogonal spreading code to each user, CDM enables multiple users to access one channel simultaneously. This concept can also be applied to sensor arrays, enabling concurrent readout of signals from multiple pixels, and overlapping pixel integration times for improved sensitivity. Our proposed sensor array supports both time division and code division.

Figure 3A:
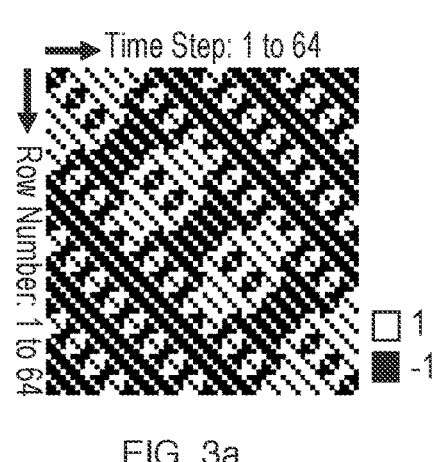
FIGS. 3a, 3b, 3c and 3d illustrate code division multiplexing.
Figure 3B:
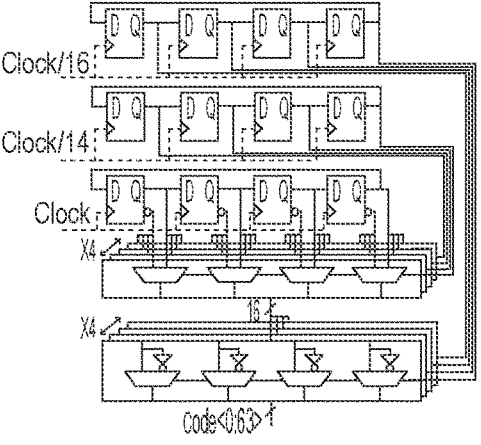
Figure 3C:
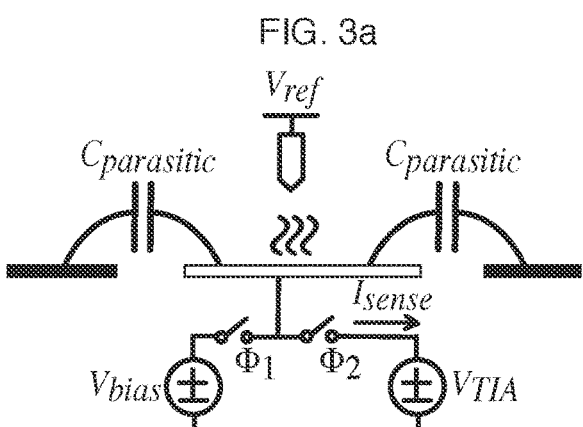

Our CDM is shown in FIGS. 3a, 3b, 3c an 3d. Here, each row is assigned a 64-bit code, represented by one row of the binary matrix shown in FIG. 3a. These codes are simple to generate with a few shift registers and multiplexers (FIG. 3b), and have the useful feature of constant code weight, which helps to reduce distortion caused by changes to the common-mode output level over time. To generate the codes, we start with an orthogonal 4×4 matrix having a constant row sum of −2, expand it a 16×16 matrix ($M_{16}$) and then to 64×64 ($M_{64}$, shown in FIG. 3a):

$$M_1 = \begin{bmatrix} +1 & -1 & -1 & -1 \\ -1 & +1 & -1 & -1 \\ -1 & -1 & +1 & -1 \\ -1 & -1 & -1 & +1 \end{bmatrix} \tag{(1)}$$

$$M_{26} = \begin{bmatrix} +M_4 & -M_4 & -M_4 & -M_4 \\ -M_4 & +M_4 & -M_4 & -M_4 \\ -M_4 & -M_4 & +M_4 & -M_4 \\ -M_4 & -M_4 & -M_4 & +M_4 \end{bmatrix} \tag{2}$$

$$M_{61} = \begin{bmatrix} +M_{16} & -M_{16} & -M_{16} & -M_{16} \\ -M_{16} & +M_{16} & -M_{16} & -M_{16} \\ -M_{16} & -M_{16} & +M_{16} & -M_{16} \\ -M_{16} & -M_{16} & -M_{16} & +M_{16} \end{bmatrix} \tag{3}$$

Figure 3D:
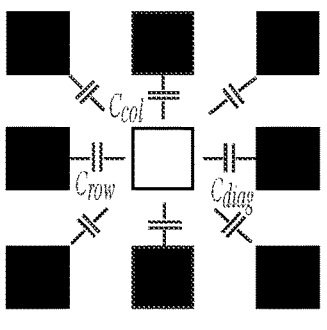

The spreading code for each row is used to control θ (FIG. 1a), modulating the polarity of the differential output current. In our measurements, we typically use a code chip rate of 1 kHz. Later, after the signals are digitized, each column time series is multiplied by $M_{64}$ to retrieve the data from each row. Compared to conventional time division, code division can be leveraged for either longer integration times or faster frame rates (FIG. 1c). Another feature of CDM is that it can shield sensing pixels from common-mode interference from parasitic capacitances to nearby electrodes. As neighboring rows now carry their own orthogonal codes and are active concurrently, the net charge injected through parasitic capacitances is reduced (FIGS. 3c and 3d).

Ion sensitive field effect transistors (ISFETs) are CMOS-compatible pH sensors which have been adopted for a wide range of biochemical sensing applications. Drift and low-frequency noise are perennial challenges for these small charge-sensitive devices. However, ISFET designers have often avoided the common circuit solution of chopper stabilization due to understandable concern that the switching will disturb the sensing gate. In a second embodiment, we provide a new configuration which modulates the source and drain voltages of the ISFET, reducing 1/f noise and drift with negligible disturbance of the sensing gate. Using in-pixel chopping, the circuit achieves a three-fold reduction in drift along with suppression of 1/f noise.

Amid the continued adoption of integrated circuit technology in biomedical applications, the ion-sensitive field effect transistor (ISFET) has cemented an important commercial role. CMOS-compatible ISFET platforms can scale up to large dense arrays, enabling high throughput DNA sequencing and assays, cellular metabolism sensing, chemical imaging, and food safety screening.

However, longer-duration applications such as cell culture monitoring can be challenging for ISFETs due to drift and flicker noise. ISFET drift is thought to originate from trap effects and transport at the sensing electrode interface, and it is affected by temperature, pH, and ion migration. Flicker (1/f) noise comes from more familiar electronic sources, and it increasingly affects ISFET transistors as their geometry scales down to support dense arrays.

It is possible to dynamically adjust the ISFET bias to reduce drift, although this requires significant supporting circuitry and may be challenging to use within arrays. Correlated double sampling (CDS) is also possible, but CDS filters out signals below the switching frequency, which is unfortunate for long-term pH monitoring. Another possibility is a differential measurement between an ISFET and a reference ISFET (REFET), but this method only suppresses the common-mode drift between the two devices. Finally, it is possible to periodically cycle the solution potential, and in turn $V_{gs}$, resetting the surface charge each time and producing a repeatable drift pattern. While effective, this method does not address 1/f noise, and large low-frequency switching transients could affect nearby cells and electrodes.

This embodiment of the present invention is an in-pixel chopping method to simultaneously reduce the drift and 1/f noise of a CMOS-integrated titanium nitride (TiN) ISFET. It has long been understood that MOSFET 1/f noise can be reduced by cycling between accumulation and inversion. However, directly chopping the solution potential at high frequencies is impractical. We have a new balanced ISFET switching scheme to modulate the source and drain voltages instead of the chemical gate. In addition to lowering 1/f noise, cycling $V_{gs}$ helps to reduce the mean electric field at the electrode, supporting slower ion crossing rates and reducing drift.

In-Pixel Chopping Circuit

Figure 4:
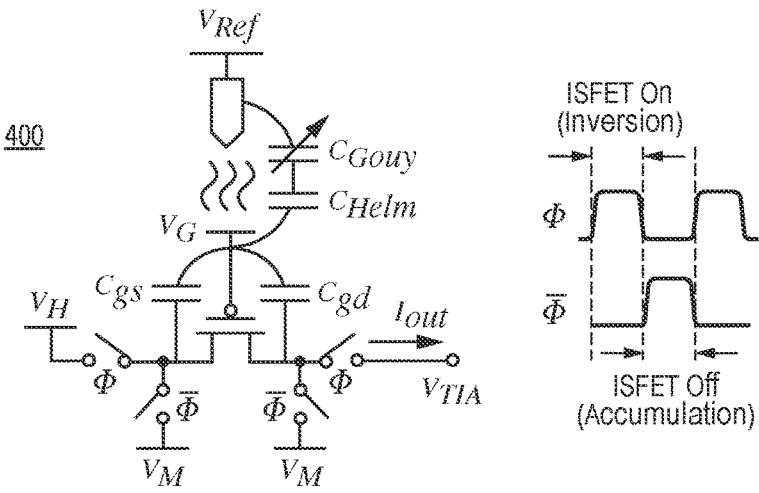
FIG. 4 illustrates operation of an in-pixel ISFET chopping circuit.

To chop the ISFET bias with minimal disturbance of the sensing gate, we designed a balanced PMOS switching structure 400, illustrated in FIG. 4. During the standby phase ($\Phi$=0), the ISFET's source and drain are both tied to $V_M$, and the device is off. $V_G$ is set indirectly, through $V_{REF}$. During the operating phase ($\Phi$=1), the PMOS source is raised to $V_H$ such that the ISFET enters strong inversion. The drain is voltage-clamped at $V_{TIA}$ while the current is measured by a transimpedance amplifier. We tested the chopping rate between 100 Hz and 10 kHz, but it can also support higher frequencies.

Much of the switching noise injected onto the gate through $C_{gs}$ and $C_{gd}$ can be compensated by simply setting $V_M$ near the midpoint between $V_H$ and $V_{TIA}$. Additionally, since the chemical interface capacitance is much larger than the device capacitances of the CMOS transistors, capacitive voltage division will further attenuate the residual switching noise. (With 100 µm2 gate area, the chemical double-layer capacitance is approximately 14 pF.)

Reductions in 1/f noise and drift can both be achieved with the proposed scheme. First, it is clear that the chopping should cycle the device between strong inversion and accumulation, which refreshes charge traps in the MOSFET channel to destroy the memory that generates 1/f noise. Although it is more typical to modulate the gate voltage, since the ISFET's chemical interface capacitance is much larger than the device capacitances, modulating the source terminal achieves the same effect while being gentler on the reference electrode and surface charges. Second, although the precise causes of drift in ISFETs are complex, several studies have focused on possible electrochemical causes. It seems reasonable to theorize that mechanisms such as ion migration will be affected by the mean vertical electric field experienced at the sensing surface. Since toggling the ISFET $V_{gs}$ reduces the effective DC field seen by the surface charges, we anticipate that the proposed switching structure may also reduce ISFET drift.

Figure 5:
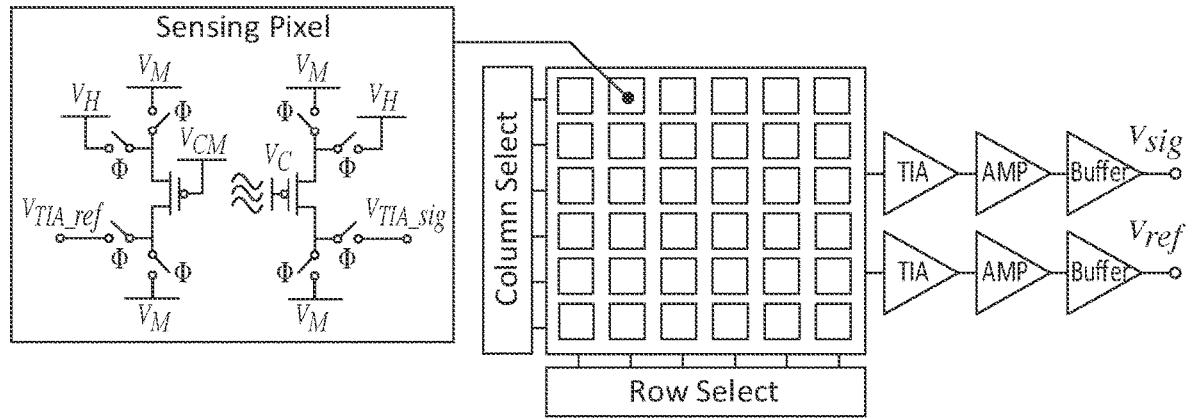
FIG. 5 illustrates an ISFET array.

In FIG. 5, an exemplary ISFET circuit 500 is shown.

ISFET Pixel and Array Design

As shown in FIG. 5, each pixel hosts two PMOS transistors, with one acting as the sensing ISFET and the other one available as a reference MOSFET. Both devices have W=440 nm and L=300 nm. The voltage references are set to $V_H$=3.3V, $V_M$=2V, and $V_{TIA}$=1.2V. $V_{ref}$ is typically held near 2V, and it can be fine-tuned depending on the $V_{TH}$ and chemical potential offsets. All switches are minimum size transmission gates to reduce clock feedthrough and charge injection.

The array has 36 pixels and the top metal gate area for each ISFET is 100 µm2. Half of the ISFETS are designed with standard silicon nitride ($Si_3N_4$) passivation above the sensing gate. The other half are fabricated with the passivation layer removed and the top metal (aluminum) exposed. We post-process the chip to etch the aluminum, exposing its vias and titanium nitride (TiN) diffusion barrier layer. Although ISFET gates are more commonly made from dielectrics ($Si_3N_4$, $Al_2O_3$, or $Ta_2O_5$), TiN is a highly stable ceramic material commonly used in semiconductor foundries, and a conductive ISFET gate may additionally lend resistance to charge screening from some absorbates.

Readout Circuits

Figure 6:
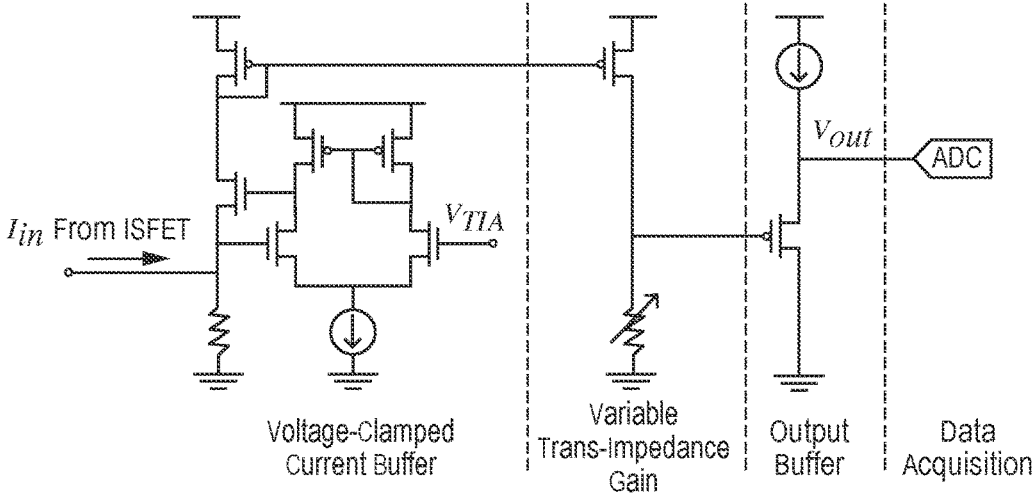
FIG. 6 illustrates readout signal paths.

In FIG. 6, an exemplary readout circuit 600 is shown. The readout circuit 600 includes a voltage-clamped current buffer, a programmable-gain transimpedance stage, and a voltage buffer. After a 2nd order anti-aliasing filter, the output voltage is digitized by a 16-bit PCI data acquisition card at sample rates up to 100 kS/s.

The voltage-clamped current buffer consists of a common-gate amplifier with gain boosting, which lowers the input impedance and clamps its input voltage to $V_{TIA}$. To reduce 1/f noise, large transistors are used, and the NMOS current mirror from is replaced with a resistor. This current buffer is designed to operate with $V_{TIA}$ ranging from 0.8V to 1.4V while maintaining its input impedance below 100Ω.

Following the current buffer is a PMOS common source amplifier with on-chip programmable load resistance and a PMOS source follower as the output stage. The gain of the readout path is −0.8 V/V, and the PMOS ISFET contributes >90% of the total input referred noise below 1 kHz.

In a third embodiment, the present invention is a large-scale fully integrated multimodal sensor array for biological imaging. The 512×256 sensor array can perform spatially resolved electrochemical impedance spectroscopy (EIS) with switching frequencies up to 100 MHz, acquire multi-color optical images, and sense pH using titanium nitride (TiN) ion sensitive field effect transistors (ISFETs). The chip features code-division multiplexed (CDM) readout of groups of pixels simultaneously, enabling extended integration times at a given frame rate. The system may be implemented in 180-nm CMOS with 9.5 μm×11.5 μm pixels. Its overall fill factor is 57%, including peripheral control and readout circuits, yielding a wide-field spatially resolved multimodal biosensing platform for advanced cell culture applications.

Integrated circuits continue to gain traction neural in a diverse array of biomedical applications, including neural recording systems, DNA sequencing instruments, and smart cell culture platforms which demand creative solutions for dense multimodal sensor integration.

There are several types of CMOS-compatible sensors that can provide useful measurements of growing cell cultures. The most classical options are photodiode arrays, which can be used for optical imaging of cells' shapes and positions even without lenses, although lens-free contact imaging often does not reach the diffraction limit. Cellular metabolism can be monitored indirectly through pH changes, recorded by ion-sensitive field-effect transistors (ISFETs). Electrochemical impedance spectroscopy (EIS) can provide spatially resolved images of the local conductivity and dielectric constant, which relate to properties of cell membranes, proteins, and extracellular matrix. EIS measurements are also frequency-dependent, offering another dimension of information. Recognizing the diversity and multiscale nature of cellular processes, a multimodal lens-free CMOS sensor array with a sufficiently large active sensing area could enable wide-field monitoring of cells, colonies, or even whole tissues at a fraction of the size and cost of traditional microscopes.

The present invention is directed towards a multimodal CMOS sensor array that measures radio-frequency impedance spectra, pH, and visible light, across 131,072 pixels. Intended for long-term cell culture monitoring, this design prioritizes a large uninterrupted sensing area. It achieves a 57% fill factor, with the active sensing region occupying more than half of the chip surface. With thousands of co-located EIS, pH, and optical measurements, this system can capture detailed spatially resolved recordings of cellular growth and metabolism.

CMOS Sensor Array Design: Pixel Design

Figure 7:
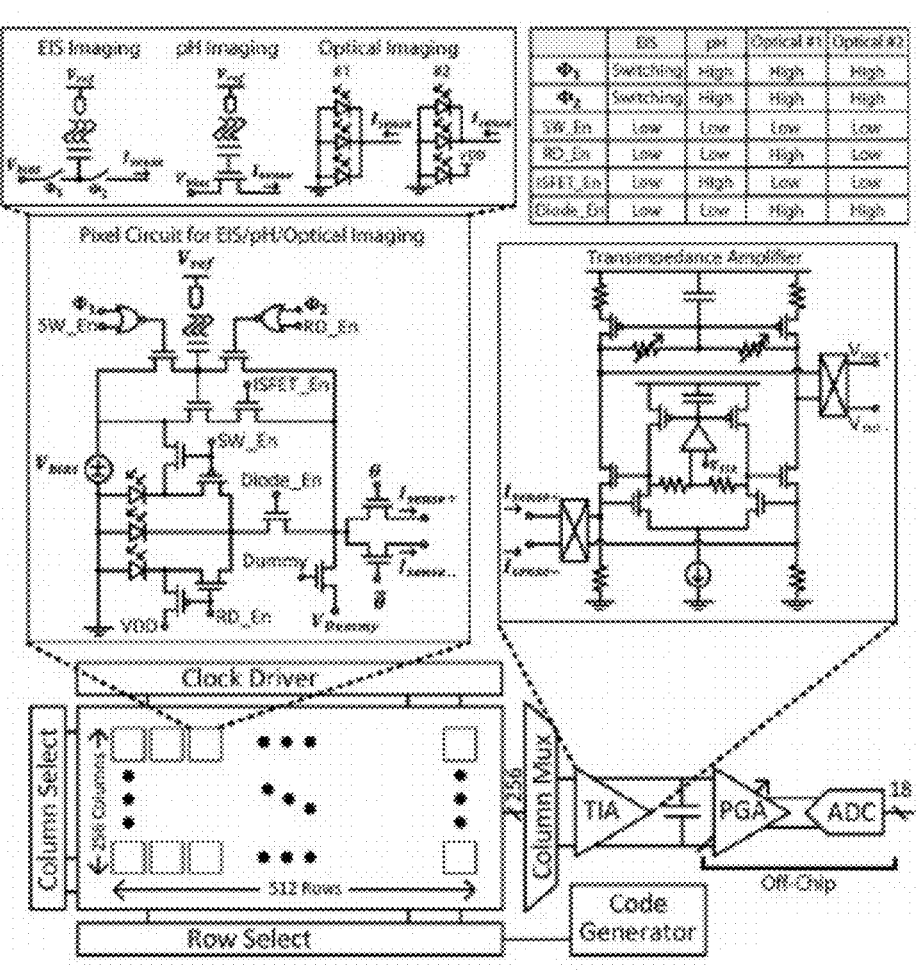
FIG. 7 illustrates a circuit diagram of a biosensor array.

In FIG. 7, an exemplary circuit diagram 700 of a biosensor array is shown. The active sensing area has 131,072 pixels arranged in a 512×256 array. Each pixel contains an exposed surface electrode, a high-frequency impedance measurement circuit, an nMOS ISFET for pH sensing, and three photodiodes for color-sensitive optical imaging. The current is steered between two shared column outputs using another set of control signals ($\theta$ and $\theta^-$). Depending on how $\theta$ is configured, the readout can support either time-division multiplexing (TDM) or code-division multiplexing (CDM). Only one type of sensor is active at a time for minimal crosstalk between sensing modes, and inactive pixels can optionally be routed to a dummy column to reduce pixel-to-pixel parasitic coupling.

1) EIS Measurement: The EIS circuits support impedance measurements up to 100 MHz using a switched capacitor circuit with nonoverlapping clocks ($\Phi_1$ and $\Phi_2$) to rapidly charge and discharge the electrode. In comparison to traditional kilohertz EIS, radio frequency operation reduces Debye screening, producing measurements sensitive to the dielectric environment farther from the electrode surface.

2) Color-Sensitive Optical Imaging: To support ratiometric absorption measurements of cell optical density across multiple wavelengths, each pixel contains a photodetector in which three diodes share the same P-substrate, but have isolated N-well cathode contacts which are biased to $V_0$, $V_1$, and $V_2$. The photodiodes are surrounded by guard rings for improved isolation. FIG. 9*a* illustrates a chip fabricated in 180-nm CMOS, and wirebonded to a small chip-on-board module. FIG. 9*b* illustrates a cross-section of a pixel. FIG. 9*c* illustrates a 3.9×6.4 mm² die. FIG. 9*d* illustrates that each multimodal pixel occupies 11.5×9.5 μm². Depending on the bias voltages, the electric field distribution will cause the cathodes to collect photons absorbed at different depths in the P-substrate. By separately collecting currents from each cathode contact, the sensor can achieve tunable wavelength selectivity.

Although there is a sensitivity penalty, this arrangement allows is to assemble a color image from multiple exposures, without a color filter mosaic. The photodiodes have a minimal impact on the total sensor area because they are positioned underneath the required spacing between the top metal electrodes.

3) pH Sensing: An ISFET is a transistor whose floating gate is connected to an electrode exposed to an ionic solution, and which measures pH through the relationship between the gate's surface charge and the device's threshold voltage. The pH measurement is performed with both EIS switches disabled, but these switches can optionally also be used to reset trapped charges and reduce ISFET drift.

Demonstrations of ISFETs in standard CMOS often use $Si_3N_4$ as the gate passivation layer or deposit additional pH sensitive dielectric materials. Here, instead of depositing additional layers, we use a single post-processing step to chemically etch away the aluminum top metal, exposing the electrodes' underlying titanium nitride (TiN) diffusion barrier, which is a conductive and highly stable material that can be used for both pH and impedance sensing.

CMOS Sensor Array Design: Column Amplifiers

Column outputs from the array are directed into a high-bandwidth differential current buffer (FIG. 7). The output voltage is low-pass filtered, amplified, and then digitized by an external 18-bit ADC at 500 kS/s. The current buffers are gain-boosted common gate amplifiers with a simulated bandwidth of 200 MHz and are used to maintain a low input impedance as well as to clamp the input voltage. Differential chopping is used to suppress 1/f noise and offsets.

All of the columns are multiplexed onto a single readout channel, which simplifies calibration and reduces the chip area and design complexity at the cost of lower frame rates. This tradeoff is acceptable since recording cell culture growth typically involves time-lapse imaging over the course of hours or days.

CMOS Sensor Array Design: Code Division Readout

Figure 8A:
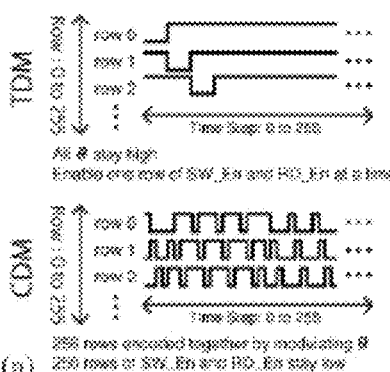
FIGS. 8a, 8b and 8c illustrate addressing logic
Figure 8B:
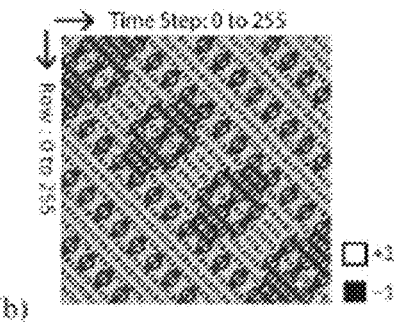
Figure 8C:
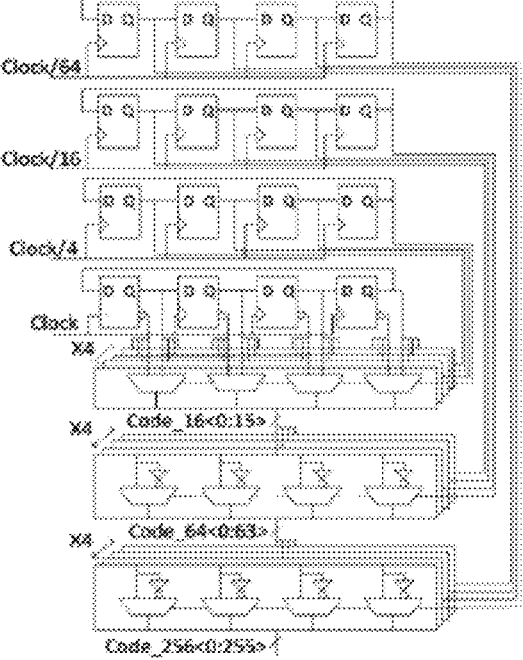

The addressing logic supports either TDM or CDM readout (FIGS. 8*a*, 8*b* 8*c*), where FIG. 8*a* illustrates a timing diagram comparison between time-division and 256-bit code-division readout, and FIG. 8*b* illustrates a binary matrix of 256-bit orthogonal codes. In TDM, pixels are measured one at a time. In contrast, CDM enables concurrent readout from blocks of pixels to extend the integration times for a given frame rate and improve the common-mode shielding from neighboring pixels.

We implemented an EIS array with 64-bit CDM readout in the past, and here we further expand the hardware capabilities to support up to 256-bit codes. A set of orthogonal codes is generated by on-chip logic [FIG. 8c], and each code is assigned to a row. The modulated currents from each row are summed into the same column, and after the signals are digitized, the time series of each column is multiplied by the encoding matrix to decode the data for each row.

All codes have a constant sum of ($\sqrt{}$(code length)), which helps to reduce distortion, but which adds a dc offset to the output current that can saturate the column amplifier. In consideration of each sensor's different typical current range, we often use 256-bit CDM for optical imaging, 64-bit CDM for EIS, and TDM for pH sensing.

With a 3 kHz code clock, EIS and optical images are each acquired in ≈50 s. For pH sensing, we allocate 1 ms/address, or ≈2.5 min per full frame. During time-lapse cell culture recordings, the system can record a set of full-frame EIS, pH, and optical images every 5 min.

In another embodiment, the present invention is directed towards a an integrated sensor array for microscale electrochemical impedance spectroscopy (EIS) imaging. In one implementation, the system is implemented in 180 nm CMOS with 10 $\mu$m×10 $\mu$m pixels. Rather than treating each electrode independently, the sensor is designed to measure the mutual capacitance between programmable sets of pixels. Multiple spatially-resolved measurements can then be computationally combined to produce super-resolution impedance images.

As articulated above, electrochemical impedance spectroscopy (EIS) is a powerful tool for chemical and biological sensing, with numerous applications in cell culture monitoring and biomolecular diagnostics. However, while biological samples have important spatial variation in their conductivity and dielectric properties, impedance is often recorded at only a single point in space. Some approaches add spatial dimensions using scanning probes or small arrays of macroscale electrodes, but many opportunities remain to take advantage of the density and scale of CMOS integrated electrode arrays. Integrated impedance imaging arrays can offer greater throughput than discrete electronics, faster acquisition than scanning probes, and finer spatial resolution than existing impedance tomography systems.

To address these challenges, we designed a 100×100 CMOS EIS sensor array that uses an area efficient two-phase switching scheme to measure the mutual capacitance between pairs of nearby pixels. The pixel grid pitch is 10 microns, and a measurement from the array can be considered as a radio-frequency impedance image which is a function of both the sensor parameters and the spatial distribution of dielectric properties within the sample above the sensor. The pixels are addressable in a pairwise manner. For example, we can record an image that represents the impedance between each electrode and the pixel one position to its left; we can then acquire a second image that describes the mutual capacitance between each pixel and the electrode two positions to its left.

By acquiring impedance images with different pairwise pixel offsets, we can assemble a high-resolution composite image from multiple frames of the same scene, using oversampling principles similar to those used for super-resolution optical image reconstruction. Compared to previous CMOS capacitance imaging arrays, the present invention's scheme only requires one extra pair of switches per pixel.

An exemplary two-phase sensing scheme of the present invention is shown in FIGS. 10a, 10b and 10c. FIG. 10a presents a model of two electrodes that are capacitively coupled to a buffer solution. C1 describes the capacitance that is only seen by electrode #1, and C2 is the capacitance that is only seen by electrode #2. CM is the mutual capacitance between these two electrodes, which may include distributed electric fields extending into the sample as well as parasitic capacitance within the sensor chip. We neglect the effects of Debye shielding because the circuit is operating at radio frequencies. We also assume that the capacitors charge faster than the switching cycle so that we can neglect any distributed resistance.

The electrodes are contained within pixels which can switch their bias voltages between multiple sources. The signal current $I_{SENSE}$ from electrode #1 is routed to a column amplifier where it is integrated and measured. $V_{BIAS}$ and $V_{STIMU}$ are provided from external voltage references, and $V_{CM}$ is the virtual ground potential of the current integrator. The timing diagram of the two sets of non-overlapping clocks is shown in FIG. 10b, where $\theta_1$ and $\theta_2$ are 180° out of phase.

Interestingly, if we set $V_{BIAS}=V_{CM}$, this circuit can be equivalent to a classical non-inverting switched capacitor integrator as shown in FIG. 10c. When both $\theta_{1,2}$ and $\theta_{2,1}$ are high, the voltage across $C_M$ is $V_{STIMU}-V_{CM}$. When both $\theta_{1,1}$ and $\theta_{2,2}$ are high, $C_M$ is discharged to 0V. Thus the average measured current can be expressed as $I_{SENSE}=C_M (V_{STIMU}-V_{CM})f_{clk}$. Since the voltage across $C_1$ does not change, $I_{SENSE}$ is only a function of $C_M$.

Figure 11A:
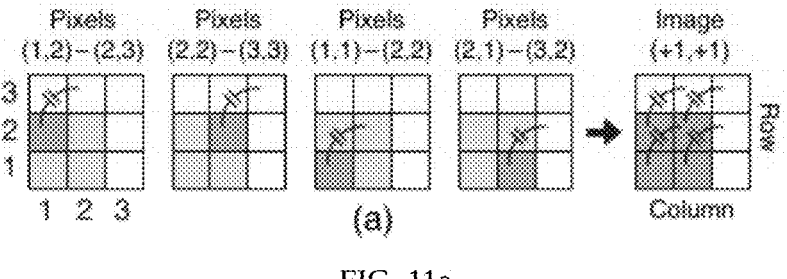
FIGS. 11A, 11b illustrate mutual capacitance imaging.
Figure 11B:
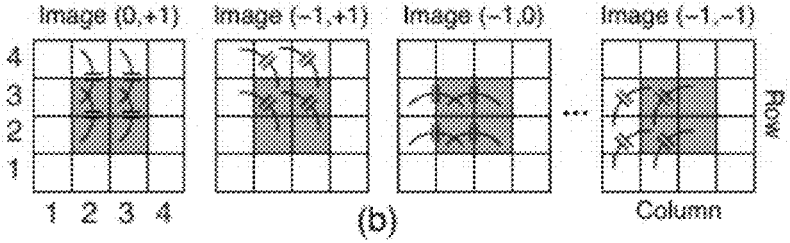

FIGS. 11a, 11b illustrate a process of scanning the sensor array to form one impedance image, and then varying the scanned pattern to create multiple different impedance perspectives. In this simplified example, we use a 3×3 kernel, where the indices of Pixel #1 and Pixel #2 from FIG. 10a are related by $(i_2, j_2)=(i_1+\delta_i, j_1+\delta j)$, where $\delta_i=\delta_j=1$. This kernel is scanned over the entire array to generate an image. The acquisition is repeated for different offset vectors $(\delta_i, \delta_j)$, producing a collection of images with slightly different dependence on the sample's spatially varying impedance. To acquire all pairwise N×N kernels requires $N^2-1$ images.

CMOS Sensor Array Design: Pixel and Array

Figure 12:
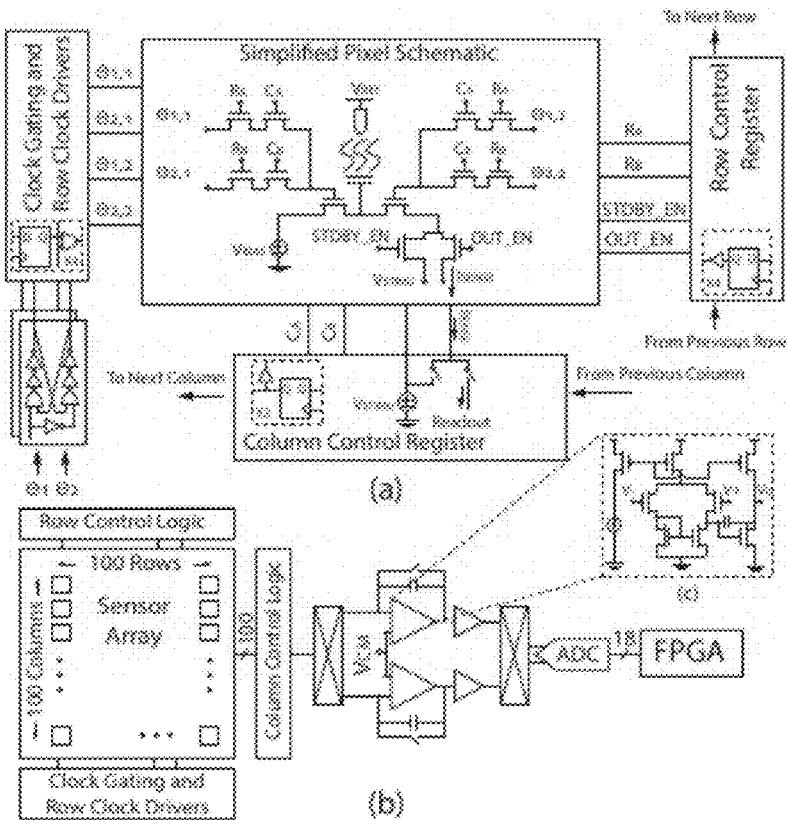
FIG. 12 illustrates an exemplary pixel and array schematic.

Simplified schematics are shown in FIG. 12. The active sensing area has 10,000 pixels arranged in a 100×100 array. Each pixel can be driven by one of two pairs of non-overlapping input clocks ($\theta_{1,1/2}$ and $\theta_{2,1/2}$), whose relative phases are synthesized by an external delay lock loop. A set of control signals drive each row ($R_{A/B}$) and column ($C_{A/B}$), to determine the clock selection in each pixel. All switches are implemented as single NMOS transistors. After each pixel measurement, the NMOS switch gates are fully discharged to prevent stored charge from interfering with the next pixel scan. The output current of each pixel can either be routed to the readout circuit or to the $V_{STIMU}$ voltage reference as shown in FIGS. 10a, 10b, 10c.

CMOS Sensor Array Design: Readout Circuit

The readout circuit shown in FIG. 12 includes chopping switches and a pair of integrators for signal amplification, followed by buffers that drive an external 500 kS/s 18-bit ADC. Differential chopping and correlated double-sampling are used to suppress the 1/f noise and offsets.

In still another embodiment, the present invention is a fringe field shaping CMOS capacitance imaging array.

As discussed herein, capacitive sensing and electrochemical impedance spectroscopy (EIS) serve a wide range of applications, from monitoring cell cultures to measuring neuron connectivity and activity, from industrial flow sensing to landmine detection. While many classical techniques measure the impedance at the surface of one working electrode at a time, more complex measurements take advantage of networks of multiple electrodes. Impedance tomography systems, for example, often interrogate pairs of elements within a small but strategically positioned electrode array. As larger and denser microelectrode arrays become available, more complex multi-electrode stimulation and measurement can enable new sensing modalities for impedance imaging with enhanced sensitivity and improved spatial resolution.

A system of the present invention includes a high-density CMOS microelectrode array, which can manipulate the fringe fields of the measured pixel by configuring the clock phases and bias voltages within a moving kernel of neighboring pixels. The circuit operates at radio frequency which extends the reach of the electric field and creates opportunities to leverage complex micron-scale interactions between the electric fields of groups of nearby pixels. This arrangement bears some relationship to both computational image sensors and impedance tomography, and it can be configured to perform some in situ signal processing while also reshaping the local electric field to extract additional information about a sample.

Fringe Field Shaping Model

FIG. 13a illustrates two pixels with a simple capacitance model. FIG. 13b illustrates two sets of non-overlapping clocks with 90° phase shift.

More specifically, a simplified model to analyze the fringe field shaping is shown in FIG. 13a, where two pixels are capacitively coupled to a buffer solution. The bulk solution is biased with $V_{REF}$, but most of the electric fields occur within tens of microns of the sensor surface. There is significant coupling between adjacent pixels ($C_M$). The chip operates at MHz frequencies, where one can largely neglect Debye screening. But at these frequencies, the fields are still pseudo-static and we exclude resistive elements for simplicity.

As shown in FIG. 13a, during the input, both pixels connect to $V_{BIAS}$ for one clock phase, and then to either $V_{CM}$ or $V_{STDBY}$. The pixels are controlled by two pairs of non-overlapping switching clocks ($\theta_1$ and $\theta_2$) with a common frequency but independent phases. Only the charge transferred through Pixel #1 is integrated by the readout circuit. If the phases of the two pixels' clocks are the same and $V_{STDBY}=V_{CM}$, then Pixel #2 serves to shield $C_M$, which can have sensing benefits as previously demonstrated. Under these conditions, the signal current is $I_{SENSE}=C_1 (V_{BIAS}-V_{CM})f_{clk}$, where $f_{clk}$ is the switching frequency. However, if there is a phase offset between neighboring pixels, more possibilities and complexities emerge. For example, FIG. 13b illustrates a 90° offset between two pixels. In this scenario, the integrated current is a function of $C_M$, expressed as $I_{SENSE}=[C_1 (V_{BIAS}-V_{CM})-C_M (V_{BIAS}-V_{STDBY})]f_{clk}$.

This two-pixel model can be generalized to a group of pixels driven by non-overlapping switching clocks with different phase offsets and biased by different output voltages. The prototype presented in this paper uses 5×5 pixel blocks to implement radial, vertical and horizontal kernels. The center pixel output is routed to the readout circuit and biased to $V_{CM}$, and the rest of the pixels are routed to $V_{STDBY}$. Physical models of these coupling capacitances will depend on the sensor parameters as well as the sample composition, and our goal is to use this complex parameter space to extract more information from spatially resolved EIS measurements.

In FIG. 14, a pixel schematic and overall architecture are illustrated. The active sensing area has 10,000 pixels in a 100×100 grid. Each pixel can use one of three sets of non-overlapping input clocks ($\theta_{x-} \Phi_1$ and $\theta_{x-} \Phi_2$), which are synthesized externally. To achieve both efficient pixel area usage and flexible kernel configurations, we use a set of pre-decoded control signals to drive each row ($R_x$) and column ($C_x$), to dictate the clock selection in each pixel. All switches are NMOS pass-gates. We also add a per-column (C_EN) control signals to disable pixels outside of the kernel. Bias voltages are supplied externally. Each pixel output can either be routed to the readout circuit or $V_{STDBY}$ based on the two-dimensional row/column control. Each pixel contains an exposed electrode shared between the EIS measurement and a pH measurement with an ion-sensitive field effect transistor (ISFET). Here we focus only on the EIS operation. To reduce 1/f noise, the output current is chopped between two integrators, and buffered for an external differential-input 500 kS/s 18-bit ADC.

Figure 15:
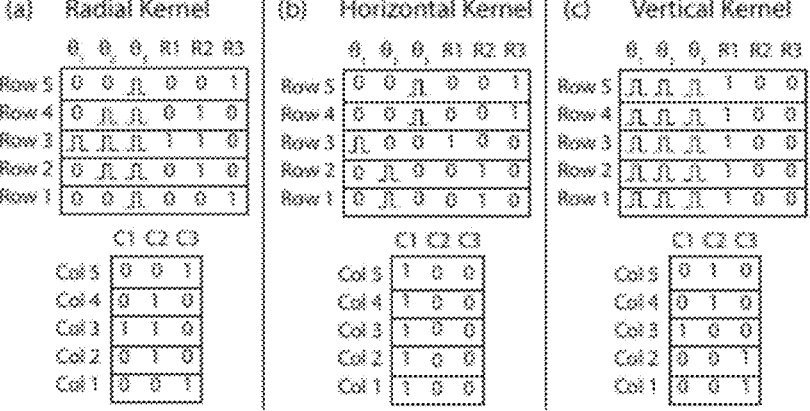
FIG. 15 illustrates tables.

While many different configurations are possible, here we demonstrate three 5×5 configurations implementing radial, horizontal and vertical kernels. The detailed control signals for each configuration are shown in FIG. 15. Often, we elect to route the center pixel to ISEN SE, while the surrounding pixels are routed to $V_{STDBY}$. On-chip logic shifts the 5×5 pattern through the 100×100 array to capture one frame, producing an image of 96×96 complete kernels.

In yet another embodiment, the present invention is directed towards a CMOS electrochemical imaging array for the detection and classification of microorganisms.

Microorganisms account for most of the biodiversity on earth. Yet while there are increasingly powerful tools for studying microbial genetic diversity, there are fewer tools for studying microorganisms in their natural environments. The present invention provides CMOS electrochemical imaging arrays for detecting and classifying microorganisms. These microscale sensing platforms can provide non-optical measurements of cell geometries, behaviors, and metabolic markers. Integrated electrochemical imaging can contribute to improved medical diagnostics and environmental monitoring, as well as discoveries of new microbial populations.

Microorganisms include all living things with microscopic dimensions. A majority of microorganisms are unicellular, and this broad category includes species from all branches of life, including archaea, protists, bacteria, and fungi. Single cells may range in diameter from 0.1 μm to 100 μm, although unicellular organisms are often found in communities and their morphologies are highly dependent on their environment. In terms of sheer numbers of unique species, microbes represent the majority of the diversity of life on earth, and billions of species of microorganisms may remain undiscovered.

Developing integrated sensors for tracking diverse microorganisms could be especially useful for distributed environmental monitoring, where sensing living organisms can provide important information which is complementary to metagenomic studies. The diversity and abundance of microorganisms in field collected samples can serve as useful metrics for assessing the ecological health of soils, rivers, and oceans. These types of studies are increasingly important in monitoring the effects of global warming on ecosystems.

It is possible to image samples without lenses, especially when the distance between the object and the photodiode array becomes very small. Many modern image sensors have pixel sizes of only 1-2 μm. In addition to resolving objects larger than single pixels, lens-free imaging can support computational imaging modes when combined with structured illumination. However, there are limits to what can be measured optically, and other sensing modalities may offer complementary forms of information.

When a sample can be placed in direct contact with a sensor, it becomes possible to consider interrogating it electrochemically instead of optically. Electrochemical sensor arrays can be miniaturized and integrated, offering both challenges and opportunities. By their nature, microscale electrochemical measurements are often noisy and prone to drift and fouling, but they can also be quite fast and low cost. In some applications, non-optical imaging could avoid complications with dyes and photobleaching, and monitor organisms independent of lighting conditions.

pH Imaging

One type of chemical sensing which is readily achieved with semiconductor technology is pH sensing using ion sensitive field effect transistors (ISFETs). An ISFET is a transistor whose floating gate is sensitive to the surface potential of an exposed electrode. By selecting an electrode material with pH-sensitive surface charge groups, the transistor's inversion charge can be made a function of the pH. ISFETs can be constructed using many common oxides and nitrides, including $SiO_2$, SiN, $Al_2O_3$, $HfO_2$, and $Ta_2O_5$.

Integrated ISFET arrays have been designed at very large scales, especially for highly parallel DNA sequencing. ISFET arrays could also be interesting for monitoring microorganisms, as pH can serve as a proxy for pCO2 and other measures of metabolism. When combined with an ion-selective membrane, an ISFET may also be designed to detect other ions, such as potassium or calcium.

Reduction-Oxidation Imaging

In addition to sensing bulk chemical properties such as pH, other electrochemically active species can also provide information about a microorganism. Some researchers have developed systems which can produce electrochemical images of electroactive metabolites as they are released by tissue samples or bacterial biofilms. Cells on microelectrode arrays can also measurably affect the transport of bulk redox species to electrodes.

Impedance and Capacitive Imaging

Electrochemical impedance spectroscopy (EIS) is traditionally used to characterize electrode surfaces, for applications including corrosion monitoring or characterizing the fouling of implanted electrodes.

It is also possible to use EIS to monitor the growth of adherent cells on surfaces or to estimate the surface coverage of bacterial biofilms. At larger dimensions, this approach has been commercialized in impedance-based cell culture monitoring systems, which use millimeter-scale interdigitated electrodes.

These examples use EIS for monitoring cells in extremely close contact with the electrode because mobile dissolved ions in the buffer form an electrostatic double layer at the surface with very high charge density. This Debye layer screens the electric field from penetrating more than a few nanometers into a sample. However, the relaxation time of the screening layer is on the order of 1 μs, and at MHz frequencies the electric field can extend farther into a sample. Radiofrequency EIS offers opportunities for imaging thicker samples or non-adherent cells. Operating at higher frequencies also makes an impedance measurement less dependent on the exact surface charge, which is prone to drift.

Biologists often image cells and microorganisms using phase contrast modes, taking advantage of the difference in dielectric properties between cells and their surroundings. EIS imaging can similarly observe changes in local dielectric properties, such as water displaced by a cell crowded with lipids, proteins, and other molecules. Under some conditions, impedance imaging can detect and localize conductivity changes more than 100 μm from the electrode surface.

Impedance Imaging of Single-Celled Algae

Figure 16:
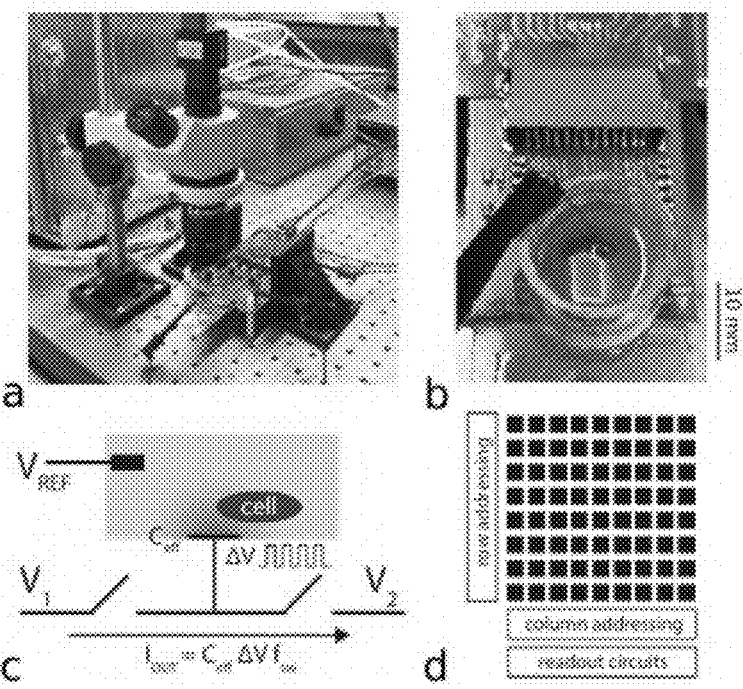
FIG. 16 illustrates an array.

To illustrate some of the types of microbial imaging that can be done using electrochemical sensors, we measured a variety of unicellular algae using a high-frequency EIS CMOS sensor array. The operating principle of the sensor is similar to those described elsewhere. Briefly, the sensor contains a grid of electrodes with a pitch of approximately 10 μm. Each electrode can be rapidly charged and discharged between two bias voltages, while the net current is measured (FIG. 16). The switching frequency can operate as fast as 100 MHz, and the charge transferred per cycle is a function of the interfacial capacitance (alternatively expressed in terms of impedance) between the metal electrode and the wet sample on its surface. A silver/silver-chloride reference electrode maintains the solution at a constant potential, although the measurement is typically not sensitive to the exact DC solution bias.

After assembling a small open fluid chamber around the sensor, we arranged the system under an inspection microscope (FIG. 16), for simultaneous optical and electrochemical visualization.

Figure 17:
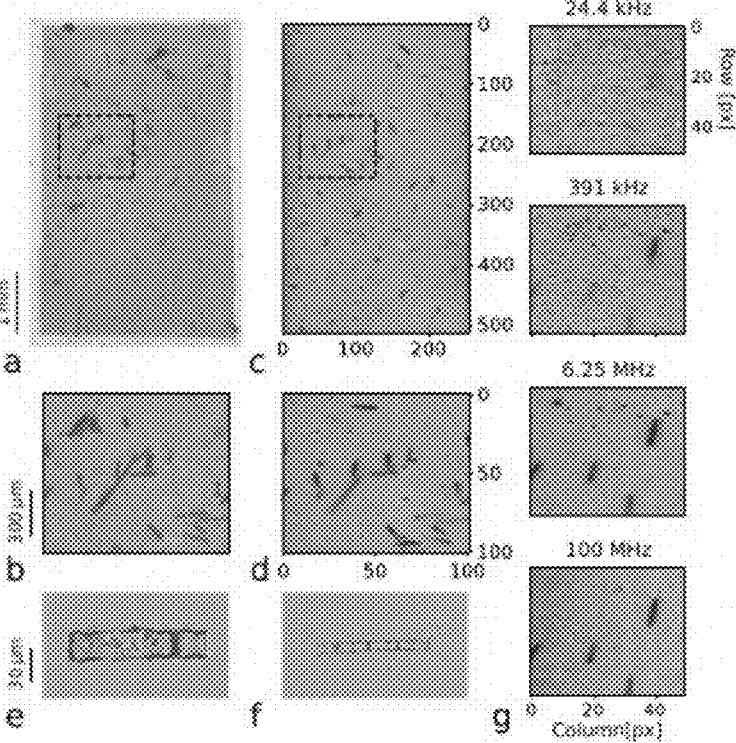
FIG. 17 illustrates EIS imaging.

FIG. 17 shows measurements of filamentous freshwater green algae dispersed onto the surface of the sensor. There is strong correlation between the optical and impedance images, and the quality of the impedance image improves significantly at higher frequencies. Despite the improved sensing depth at radio frequencies, not all of the algae cells are detected in the impedance image. The rectangular cells have widths on the order of 20 μm, and they do not all lie flat on the sensor surface.

Figure 18:
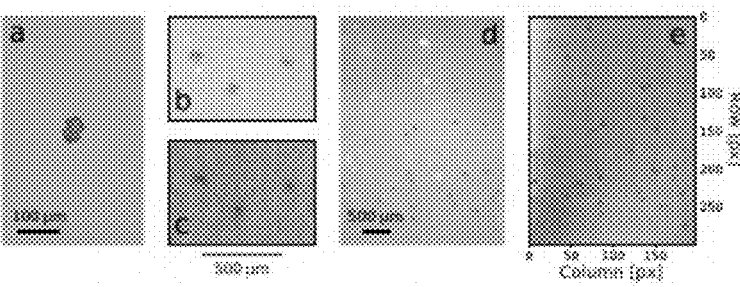
FIG. 18 illustrates algae.

In FIG. 18 we see measurements of *Cosmarium turpinii*, a freshwater algae with a cell diameter of approximately 50 μm and a notable constriction in the middle. Individual cells are clearly detected by CMOS impedance imaging, although the subcellular structure is only sometimes observable. Cells with consistent and distinct shapes offer interesting test cases for evaluating the spatial resolution of CMOS biosensors.

Figure 19:
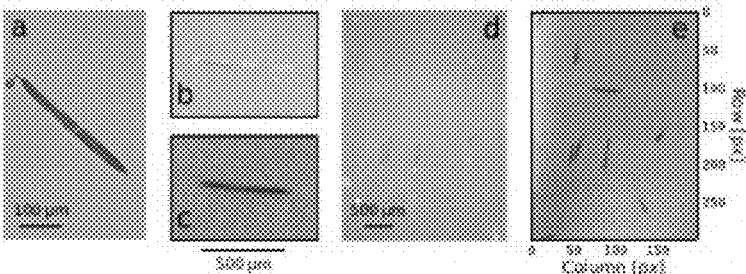
FIG. 19 illustrates algae.

FIG. 19 shows images of *Closterium acerosum*, another type of freshwater green algae which has crescent-shaped cells with tapered ends. These larger cells are very clearly resolved, though on occasion we can see some loss of contrast as part of the cell appears to extend farther from the sensor surface.

Figure 20:
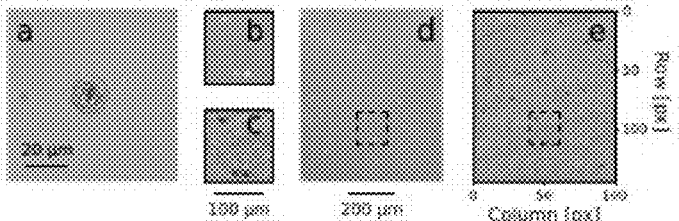
FIG. 20 illustrates algae.

Smaller microalgae are more challenging to detect. FIG. 20 shows measurements of *Cyclotella* sp., which are round and flat marine diatoms with diameters close to the size of the 10 μm sensor pixels. Some of these cells are clearly detected, but they appear primarily as single points in the EIS image.

Figure 21:
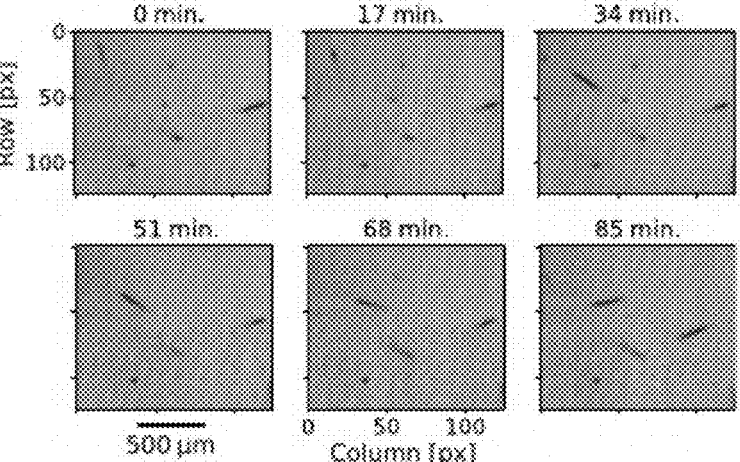
FIG. 21 illustrates single cells.

Impedance images can be resolved temporally as well as spatially. *Closterium* (FIG. 19) can move by secreting mucilage to push away from objects in their environment. FIG. 21 shows snapshots from a 1.5 hour impedance timelapse movie, in which single *Closterium* cells can be seen moving laterally across the sensor and vertically in and out of the sensing volume. Visualizing the kinetics of cellular growth and motion offer another opportunity for characterizing and identifying microorganisms.

Figure 22:
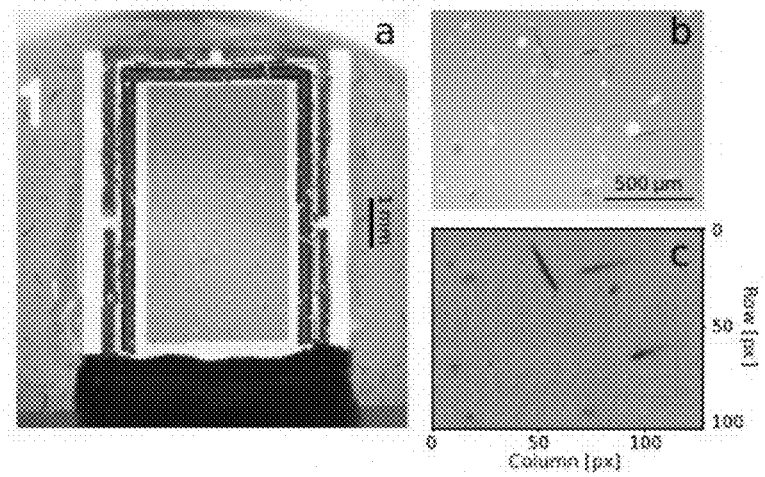
FIG. 22 illustrates mixed algae.

Clearly any natural environment will present mixtures of species, rather than pure cultures. FIG. 22 shows a mixture of *Cosmarium* and *Closterium* algae cells dispersed onto an EIS array. Even with this simple mixture, we can begin to appreciate the challenge of not merely detecting cells, but also classifying them.

Figure 23:
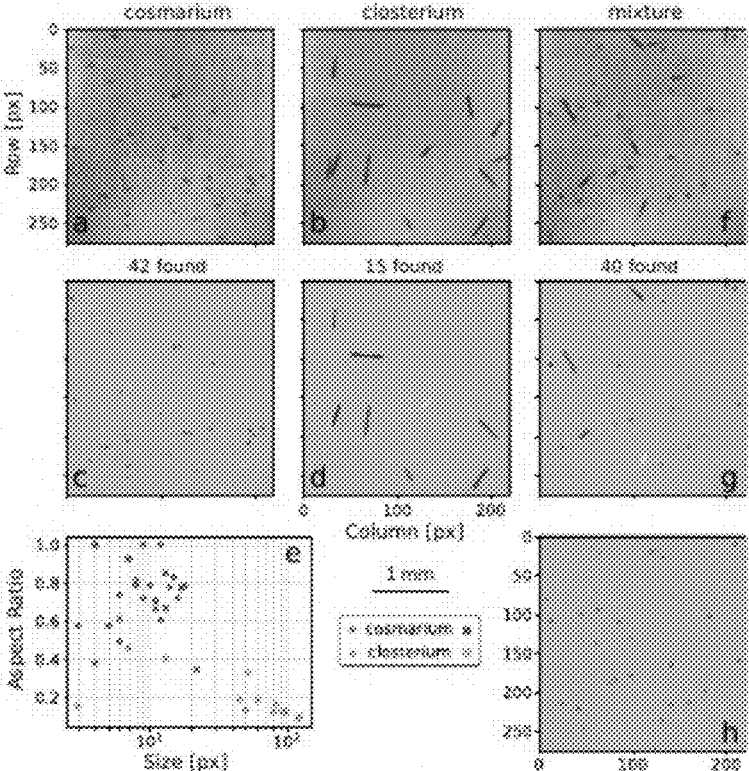
FIG. 23 illustrates classifying algae.

In FIG. 23, we show an example from a dataset in which cells were segmented from the background, and a classifier was trained on images of pure *Cosmarium* and *Closterium* cells. The classification was based on two simple shape metrics, cell area and aspect ratio. This classifier was then applied to a mixed sample, where it was able to successfully label a large majority of the cells. Most of the errors occurred when *Closterium* cells were tilted out of the sensing plane and mistaken for smaller *Cosmarium* cells. Automated phenotype classification from microscopy data is an exciting and active area of research, and as the spatial resolution of electrochemical images improves, there will be more opportunities for applying machine learning to these rich datasets.

It would be appreciated by those skilled in the art that various changes and modifications can be made to the illustrated embodiments without departing from the spirit of the present invention. All such modifications and changes are intended to be within the scope of the present invention except as limited by the scope of the appended claims.

What is claimed is:

1. A system comprising:
a complementary metal-oxide-semiconductor (CMOS) sensor array comprising an active sensing area of a plurality of pixels arranged in an array, wherein each pixel of the plurality of pixels comprises an exposed surface electrode alongside switches and logic gates; and
circuitry configured to:
during an operating phase:
raise a source voltage of the CMOS sensor array to a high voltage;
clamp a drain voltage of the CMOS sensor array to a low voltage corresponding to a transimpedance amplifier;

measure, using the transimpedance amplifier, currents from each row of a plurality of rows of the plurality of pixels; and
multiplex, using code division multiplexing and based on a plurality of spreading codes, output from a block of pixels of the active sensing array of the plurality of pixels; and
during a standby phase:
tie both the source voltage of the CMOS sensor array and the drain voltage of the CMOS sensor array to a medium voltage between the high voltage and the low voltage.

2. The system of claim 1, wherein the active sensing area of the plurality of pixels comprises 4,096 pixels, and wherein each of the plurality of spreading codes is 256 bits.

3. The system of claim 1, wherein the circuitry is configured to multiplex the output from the block of pixels by summing currents from each row into a same column.

4. The system of claim 1, wherein a first clock of two non-overlapping clocks is configured to drive a first pixel of the plurality of pixels, wherein a second clock of the two non-overlapping clocks is configured to drive a second pixel of the plurality of pixels.

5. The system of claim 1, wherein each of the plurality of pixels comprises an ion-sensitive field-effect transistor (IS-FET) pixel.

6. The system of claim 5, wherein each ISFET pixel comprises a first P-Channel Metal-Oxide-Semiconductor (PMOS) transistor and a second PMOS transistor.

7. The system of claim 1, wherein each of the plurality of pixels is configured to measure one or more of:
Radio-frequency impedance spectra,
pH, or
visible light.

8. The system of claim 1, wherein the circuitry is further configured to:
maintain, during both the operating phase and the standby phase, a gate voltage of the CMOS sensor array at a reference voltage.

* * * * *